(12) United States Patent
Lau et al.

(10) Patent No.: US 7,915,741 B2
(45) Date of Patent: Mar. 29, 2011

(54) SOLDER BUMP UBM STRUCTURE

(75) Inventors: Siong Cho Lau, Perak (MY); Tze Peng Theng, Perak (MY)

(73) Assignee: Unisem Advanced Technologies SDN. BHD., Kuala Lumpur (MY)

( * ) Notice: Subject to any disclaimer, the term of this patent is extended or adjusted under 35 U.S.C. 154(b) by 0 days.

(21) Appl. No.: 12/380,187

(22) Filed: Feb. 24, 2009

(65) Prior Publication Data

US 2010/0213608 A1    Aug. 26, 2010

(51) Int. Cl.
  *H01L 23/48* (2006.01)
  *H01L 23/52* (2006.01)
  *H01L 29/40* (2006.01)
(52) U.S. Cl. .................. 257/780; 257/781; 257/782
(58) Field of Classification Search .......... 257/780–782, 257/734, 737, 738
See application file for complete search history.

(56) References Cited

U.S. PATENT DOCUMENTS

| | | | |
|---|---|---|---|
| 6,413,851 B1 | 7/2002 | Chow et al. | |
| 6,501,185 B1 | 12/2002 | Chow et al. | |
| 6,638,847 B1 | 10/2003 | Cheung et al. | |
| 6,716,738 B2 | 4/2004 | Kim et al. | |
| 6,878,465 B2 | 4/2005 | Moon et al. | |
| 7,119,002 B2 * | 10/2006 | Lin | 438/612 |
| 2004/0217482 A1 | 11/2004 | Wang et al. | |
| 2005/0012211 A1 * | 1/2005 | Kung et al. | 257/734 |

* cited by examiner

*Primary Examiner* — Thien F Tran
(74) *Attorney, Agent, or Firm* — Wiggin and Dana LLP; Gregory S. Rosenblatt; Wanli Wu

(57) ABSTRACT

Disclosed is an under bump metallization structure including a plurality of metal or metal alloy layers formed on chip bond pads. The disclosed UBM structure has a stress improvement on the semiconductor device because the thickness of the copper-base layer is reduced to between about 0.3 and 10 microns, preferably between about 0.3 and 2 micron. The presence of the pure tin layer prevents oxidation and contamination of the nickel-base layer. It also forms a good solderable surface for the subsequent processes. Also disclosed are semiconductor devices having the disclosed UBM structure and the methods of making the semiconductor devices.

15 Claims, 2 Drawing Sheets

SOLDER BUMP UBM STRUCTURE

BACKGROUND

1. Field

This disclosure relates generally to semiconductor devices and the methods of formation, and more particularly to a reliable under bump metallization (UBM) having multiple metal or metal alloy layers.

2. Description of the Related Art

Interconnections between semiconductor-based integrated circuits, commonly referred to as "chips" and package leads are performed by wire bonding, solder bumps or tape automated bonding (TAB). Among them, wire bonding technique is most commonly used because of its low cost. However, when the size of the chip-package interconnection scales down, the performance and reliability of wirebonding may be affected since wirebonding requires the routing of all the input/output (I/O) connections to the edges of the chip.

Solder bumping is the use of reflowable solder balls to join contacts on the chip with corresponding contacts on the package. It provides an useful alternative to the traditional wirebonding technology. The solder bumps are normally deposited on the bond pads located on the top side of the substrate that carries the chip. Between the solder bump and the chip, however, there is typically an UBM structure. One such UBM is disclosed in U.S. Pat. No. 6,878,465, which is incorporated by reference in its entirety herein.

The UBM structure serves as an electrical and mechanical interface between the bond pad and the solder bump. It provides needed adhesion and also serves as a diffusion barrier between the solder bump and the bond pad.

Most UBM structures include multiple layers of metal or metal alloys. Copper is a commonly used metal in the UBM structures. It increases bondability and wettability of the solder.

It is known that tin in the solder bump reacts with copper in the UBM structure by heat generated either in the course of reflow or during the use of the chip to form an intermetallic compound. Since the formed intermetallic compound is brittle, the bonding strength between the solder bump and the bond pad would be greatly compromised if copper is in direct contact with the solder bump. In addition, to prevent self-extinguishing of copper resulting from such reaction, a very thick copper layer is normally used, on the order of 4-8 microns according to U.S. Patent Publication 2004/0217482. Since copper has a high coefficient of thermal expansion (CTE), when more copper is used, more thermal stress will be induced.

Nickel is slower in reaction rate with tin than copper and has been incorporated into UBM structures to protect the copper layer. However, the UBM structures including the nickel layer suffer from the problem related with poor solderability of nickel and residual stress inherent in the nickel layer.

U.S. Pat. No. 6,716,738 discloses forming another copper or gold layer between the solder bump and the nickel layer to increase the wettability and bondability of the UBM structure. However, gold is not cost effective and when copper is used, intermetallic material will form since copper will be in direct contact with the solder bump. U.S. Pat. No. 6,716,738 is incorporated by reference in its entirety herein.

There is still a need for an UBM structure that has a thin copper layer while at the same time has good wettability and bondability.

BRIEF SUMMARY

The present disclosure provides an under bump metallization structure including a titanium-base layer disposed over a chip bond pad, a copper-base layer disposed over the titanium-base layer, a nickel-base layer disposed over the copper-base layer and a pure tin layer or tin alloy layer (such as tin-silver) disposed over the nickel-base layer.

The disclosed UBM structure has a stress improvement on the semiconductor device because the thickness of the copper-base layer is reduced to between about 0.3 micron and 10 microns, preferably between about 0.3 micron and 2 micron. The presence of the pure tin or tin alloy layer prevents oxidation and contamination of the nickel-base layer. It also forms a good solderable surface for the subsequent processes.

The present disclose also provides semiconductor devices having the disclosed UBM structure and the methods of making the same.

DETAILED DESCRIPTION

Figure 1:
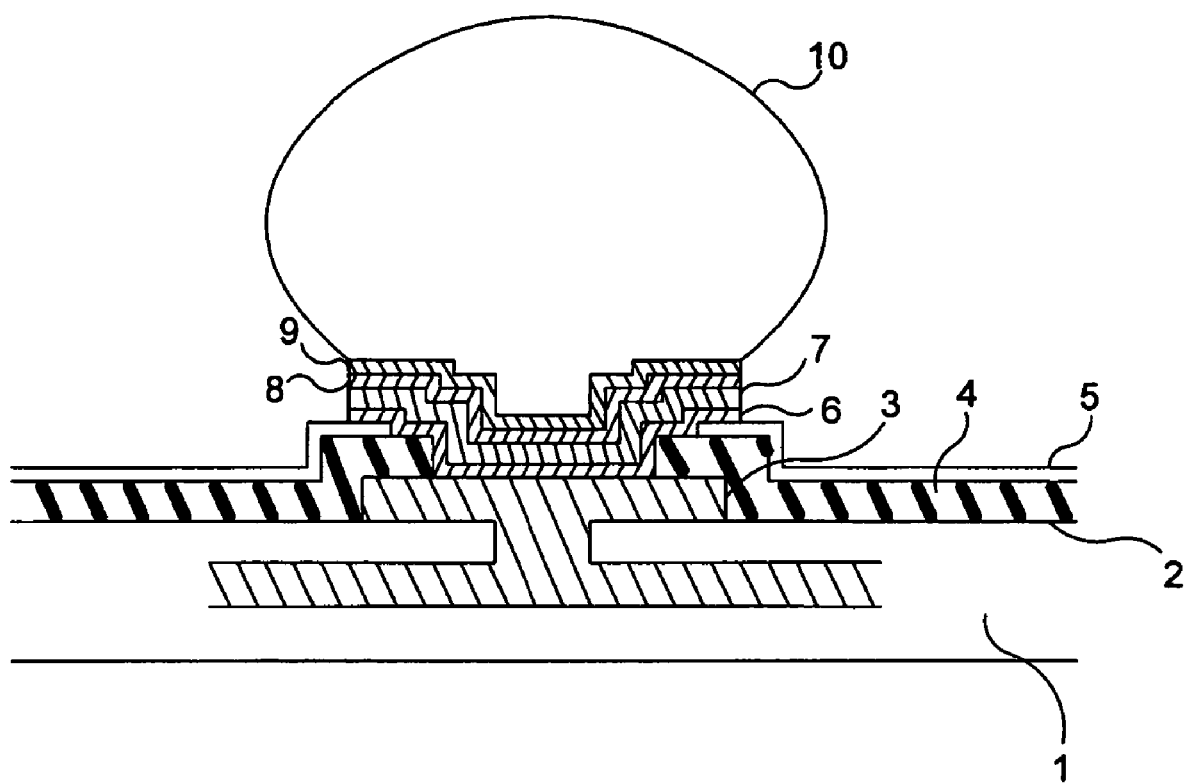
FIG. 1 illustrates a cross-sectional view of an isolated portion of a semiconductor device according to one embodiment of the disclosure.

FIG. 1 illustrates a cross-sectional view of an isolated portion of a semiconductor structure formed on substrate 1 according to one embodiment of the disclosure. As shown in FIG. 1, on surface 2 of substrate 1, there is a bond pad 3. Bond pad 3 can be formed via any conventional means. It is made of a conductive material. Most commonly used is Al or Cu.

There is at least one passivation layer 4 formed over substrate 1 and bond pad 3. Passivation layer 4 in FIG. 1 is normally formed of an insulation material such as silicon oxide and silicon nitride. Electrical isolation is the primary function of passivation layer 4. It also serves to keep out dust and moisture to protect the chip from corrosion and other damages. Dielectric layer 5 on top of passivation layer 4 is made of an organic material preferably polyimide. Dielectric layer 5 is compliant and may serve as a stress buffer layer.

There is an aperture formed in dielectric layer to expose at least a portion of bond pad 3. The aperture can be any shape and size. When multiple passivation layers are used, at least a portion of each passivation layer is also exposed.

The UBM structure is composed of a plurality of metal layers formed on bond pad 3 where no two adjacent layers are formed of same metal or metal alloy. The first metal or metal alloy layer 6, disposed on bond pad 3 and part of passivation layers 4 and 5, is preferably titanium-base. By base, it is meant that at least 50% of the alloy is the specified metal, in this instance, titanium. It provides good adhesion between bond pad 3 and second metal or metal alloy layer 7 and has a thickness of from about 500 to 3000 A.

Layer 7, disposed over layer 6, is preferably copper-base. This layer provides good electrical connection between solder bump 10 and bond pad 3. It has a thickness of about 0.3 to 10 microns, and preferably from about 0.3 to 2 microns. Compared with conventional UBM structures, the copper layer according to the instant disclosure is thin. Because copper has a high CTE and the stress level is a function of CTE difference and thickness, the UBM with thin copper layer greatly reduces the thermal stress, thus improving reliability of solder bump to bond pad connection.

A third metal or metal alloy layer, layer 8, is disposed over layer 7. It is preferably made of nickel-base and has a thickness of from about 1.0 micron to 5.0 microns. Layer 8 serves as a good barrier for intermetallic formation between layer 7 and solder bump 10. Even though the copper layer is very thin according to the present disclosure, it won't be self extinguished because of the presence of the nickel layer in the disclosed thickness.

Layer 9, disposed on layer 8, is made of pure tin or tin alloy and has a thickness of from about 2 microns to about 10 microns. This layer servers to increase wettability and bondability of the UBM structure and prevent contamination of layer 8. The tin layer also facilitates the following manufacture process.

Each layer of the UBM structure can be formed using any conventional fabrication techniques, for example, sputtering, evaporation and plating processes.

Solder bump 10 is disposed over layer 9 through the use of screen-printing technology or solder sphere drop technique.

Figure 2:
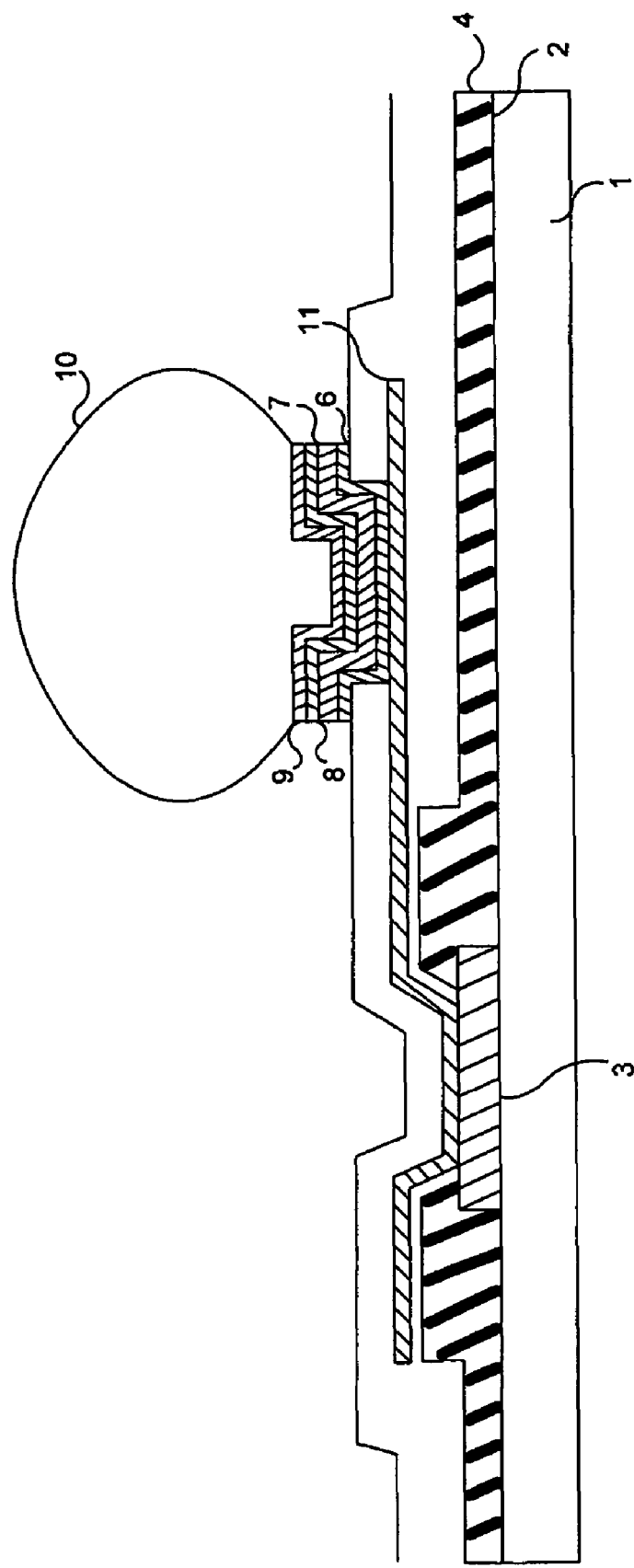
FIG. 2 illustrates a cross-sectional view of an isolated portion of a semiconductor device having redistributed bond pads.

As shown in FIG. 2, the UBM structure can be offset from chip bond pad 3 through redistribution layer 11. Redistribution layer 11 covers bond pad 3 and includes at least one metal layer electrically connected to bond pad 3. For example, the redistribution layer may include a titanium layer and a copper layer, where the titanium layer overlies bond pad 3 and the copper layer deposits over the titanium layer. The redistribution layer is normally covered by one or more passivation layers. The passivation layer is formed with an aperture for exposing a porting of redistribution layer 11. The UBM structure as disclosed in the first embodiment is formed over bond pad 3 in a manner as to completely cover exposed bond pad 3.

What is claimed is:

1. An under bump metallization (UBM) structure comprising:
    a first metal or metal alloy layer disposed over a bond pad of a semiconductor substrate;
    a second metal or metal alloy layer disposed over said first layer;
    a third metal or metal alloy layer disposed over said second layer;
    a fourth metal or metal alloy layer disposed over said third layer, said fourth layer consisting essentially of pure tin or a tin-silver alloy and being in contact with a solder bump;
    wherein no two adjacent layers are formed of same metal or metal alloy.

2. The UBM structure of claim 1 wherein said first layer is titanium-base.

3. The UBM structure of claim 2 wherein said second layer is copper-base.

4. The UBM structure of claim 3 wherein said third layer is nickel-base.

5. The UBM structure of claim 4 wherein said first layer has a thickness of about 500-3000 A; said second layer has a thickness of about 0.3-10 microns; said third layer has a thickness of about 1.0-5.0 microns; and said fourth layer has a thickness of about 2.0-10.0 microns.

6. The UBM structure of claim 1 wherein said first layer has a thickness of about 500-3000 A.

7. The UBM structure of claim 6 wherein said second layer has a thickness of about 0.3-10 microns.

8. The UBM structure of claim 7 wherein said third layer has a thickness of about 1.0-5.0 microns.

9. The UBM structure of claim 8 wherein said fourth layer has a thickness of about 2.0-10.0 microns.

10. The UBM structure of claim 9 wherein said first layer is titanium-base; said second layer is copper-base; and said third layer is nickel-base.

11. The UBM structure of claim 1 wherein the fourth layer consisting essentially of pure tin.

12. The UBM structure of claim 1 wherein the fourth layer is a tin-silver alloy.

13. A wafer structure, comprising:
    a substrate having a bond pad and a passivation layer, said passivation layer having an aperture that expose at least a portion of said bond pad;
    an UBM structure formed on said aperture and part of said passivation layer, wherein said UBM structure comprises:
        a first metal or metal alloy layer disposed on said aperture and part of said passivation layer;
        a second metal or metal alloy layer disposed on said first layer;
        a third metal or metal alloy layer disposed on said second layer,
        a fourth metal or metal alloy layer disposed on said third layer, said fourth layer consisting essentially of pure tin or a tin-silver alloy, wherein no two adjacent layers are formed of same metal or metal alloys;
    a solder bump formed on said UBM structure.

14. The wafer structure of claim 13 wherein the fourth layer of the UBM structure consists essentially of pure tin.

15. The wafer structure of claim 13 wherein the fourth layer of the UBM structure is a tin-silver alloy.

* * * * *